United States Patent
Choi

(10) Patent No.: US 7,912,104 B2
(45) Date of Patent: Mar. 22, 2011

(54) SEMICONDUCTOR LASER DIODE

(75) Inventor: Yoon Ho Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/123,814

(22) Filed: May 20, 2008

(65) Prior Publication Data

US 2008/0298414 A1  Dec. 4, 2008

(30) Foreign Application Priority Data

Jun. 1, 2007  (KR) .................. 10-2007-0053882

(51) Int. Cl.
*H01S 5/00* (2006.01)

(52) U.S. Cl. .............. 372/45.012; 372/45.01; 372/46.01

(58) Field of Classification Search .................. None
See application file for complete search history.

(56) References Cited

U.S. PATENT DOCUMENTS

| | | | | |
|---|---|---|---|---|
| 4,745,612 A * | 5/1988 | Hayakawa et al. | ......... | 372/45.01 |
| 4,839,899 A * | 6/1989 | Burnham et al. | .......... | 372/45.01 |
| 5,555,271 A * | 9/1996 | Honda et al. | ................ | 372/45.01 |
| 6,055,253 A * | 4/2000 | Kidoguchi et al. | ......... | 372/45.01 |
| 6,060,335 A * | 5/2000 | Rennie et al. | ................... | 438/46 |
| 6,160,829 A * | 12/2000 | Sawano | ....................... | 372/45.01 |
| 6,829,271 B2 * | 12/2004 | Sato et al. | .................. | 372/44.01 |

* cited by examiner

*Primary Examiner* — Minsun Harvey
*Assistant Examiner* — Sean Hagan
(74) *Attorney, Agent, or Firm* — Ked & Associates LLP

(57) ABSTRACT

A semiconductor laser diode capable of improving reliability and mass-productivity is disclosed. The semiconductor laser diode comprises a first clad layer; a first optical guide layer disposed on the first clad layer; an active layer disposed on the first optical guide layer; a second optical guide layer disposed on the active layer; and a second clad layer disposed on the second optical guide layer, having a greater band gap energy than the second optical guide layer, the band gap energy decreasing as being farther from the second optical guide layer.

13 Claims, 6 Drawing Sheets

SEMICONDUCTOR LASER DIODE

This application claims the benefit of the Korean Patent Application No. 10-2007-0053882, filed on Jun. 1, 2007, which is hereby incorporated by reference as if fully set forth herein.

BACKGROUND OF THE INVENTION

1. Field of the Invention

The present invention relates to a semiconductor laser diode, and more particularly, to a semiconductor laser diode capable of improving reliability and mass productivity of the product.

2. Discussion of the Related Art

Recently, in accordance with the spread of optical recording and reproducing devices such as a DVD, demand for a semiconductor laser diode (LD), that is, the essential part of the optical recording and reproducing device is being radically increased. Especially, since the technology achieving a high density DVD or a Blue-ray disc having capacity of tens of gigabytes is commercialized, researches have been actively performed into the nitride semiconductor LD of about 405 nm wavelength.

However, further advancement is required because there are still technical limits to guarantee reliability and yield of the nitride semiconductor LD.

SUMMARY OF THE INVENTION

Accordingly, the present invention is directed to a semiconductor laser diode that substantially obviates one or more problems due to limitations and disadvantages of the related art.

An object of the present invention is to provide a semiconductor laser diode capable of omitting a dedicated electron barrier layer, by using a structure capable of serving as both the electron barrier layer and a clad layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor laser diode comprises a first clad layer; a first optical guide layer on the first clad layer; an active layer on the first optical guide layer; a second optical guide layer on the active layer; and a second clad layer on the second optical guide layer, having a greater band gap energy than the second optical guide layer, the band gap energy decreasing as being farther from the second optical guide layer.

In another aspect of the present invention, a semiconductor laser diode comprises a first clad layer; a first optical guide layer on the first clad layer; an active layer on the first optical guide layer; a second optical guide layer on the active layer; and a second clad layer on the second optical guide layer, comprising a nitride semiconductor layer containing Al, wherein the Al decreases as being farther from the second optical guide layer.

In yet another aspect of the present invention, a semiconductor laser diode, comprises a first electrode; a conductive substrate on the first electrode; a semiconductor layer having a multi-layer structure, being disposed on the conductive substrate; a clad layer on the semiconductor layer, having a greater energy band gap than an adjacent layer of the semiconductor layer, the energy band gap of the clad layer being decreased as being farther from the semiconductor layer; and a second electrode on the clad layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Figure 1:
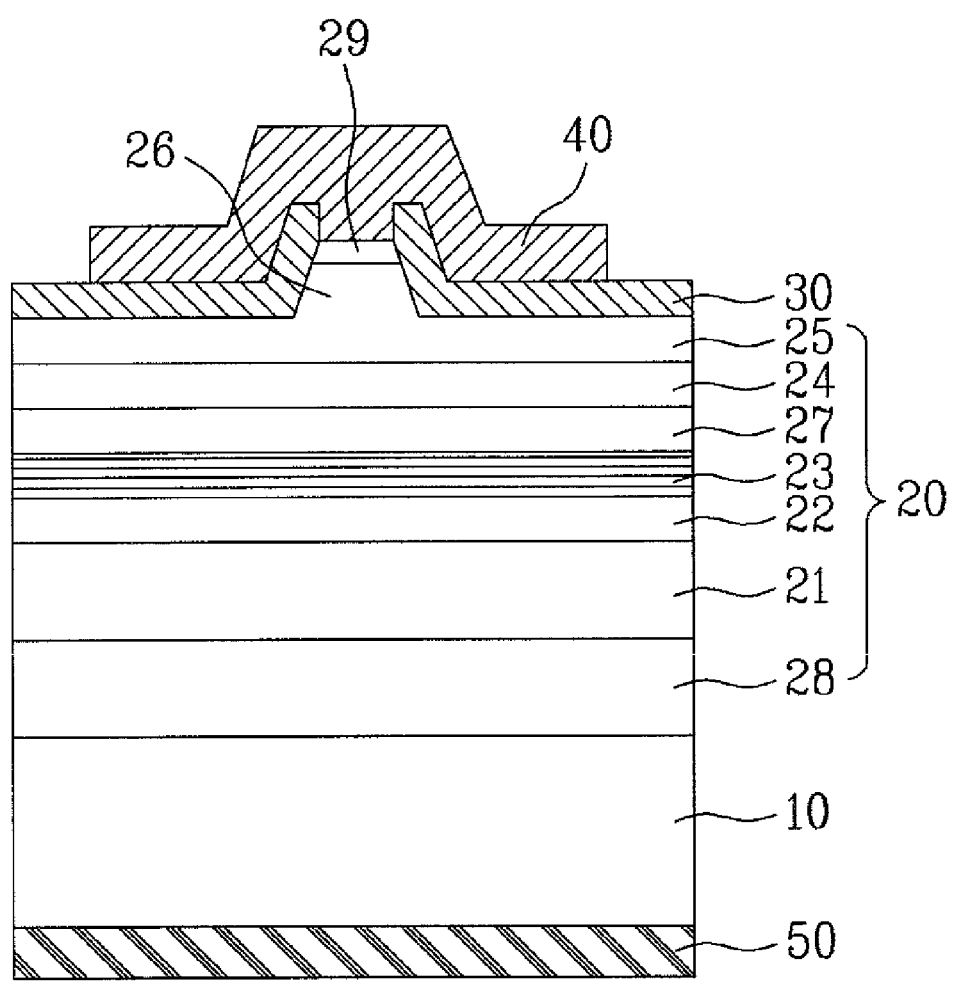
FIG. 1 is a sectional view of a semiconductor laser diode according to a first embodiment of the present invention.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

In the following description, the same reference numbers will be used throughout the drawings to refer to the same or like parts. In the drawings, layers and regions are excessively enlarged to be clearly seen and explained.

It will be understood that when an element such as a layer, region or substrate is referred to as being "on" another element, the element may be disposed directly on another element or an interposing element may exist between them. It will also be understood that if part of an element, such as a surface, is referred to as "inner," it is farther from the outside of the device than other parts of the element.

Those terms are used to refer to other directions in addition to the directions illustrated in the drawings. Furthermore, the terms "directly" herein means "without any interposing element between other two said elements." Finally, when "and/or" is used, this refers to any combination, that is, all possible combinations comprising one or more of the mentioned items.

It will be understood that, although the terms first, second, etc. may be used herein to describe various elements, components, regions, layers and/or sections, these elements, components, regions, layers and/or sections should not be limited by these terms.

First Embodiment

The thin film structure of a nitride semiconductor laser diode is grown on a substrate through single crystal growth. As shown in FIG. 1, a thin film structure 20 of a semiconductor comprises an n-type clad layer 21, an n-type optical guide layer 22, an active layer 23, a p-type optical guide layer 24, and a p-type clad layer 25 which are disposed on a conductive substrate 10 in the listed order.

An upper side of the p-type clad layer 25 includes a ridge structure 26, and a dielectric layer 30 having an opening corresponding to the upper part of the ridge structure 26 is disposed on the upper side of the p-type clad layer 25.

On an upper side of the dielectric layer 30, a p-type electrode 40 is formed in contact with the p-type clad layer 25 through the opening of the dielectric layer 30. An n-type electrode 50 is disposed on a lower side of the conductive substrate 10.

In addition, an electronic barrier layer (EBL) 27 may be interposed between the active layer 23 and the p-type clad layer 25.

An n-type electrode layer 28 may be formed between the conductive substrate 10 and the n-type clad layer 21. Also, a p-type electrode layer 29 may be further formed between the upper part of the ridge structure 26 of the p-type clad layer 25 and the p-type electrode 40.

Figure 2:
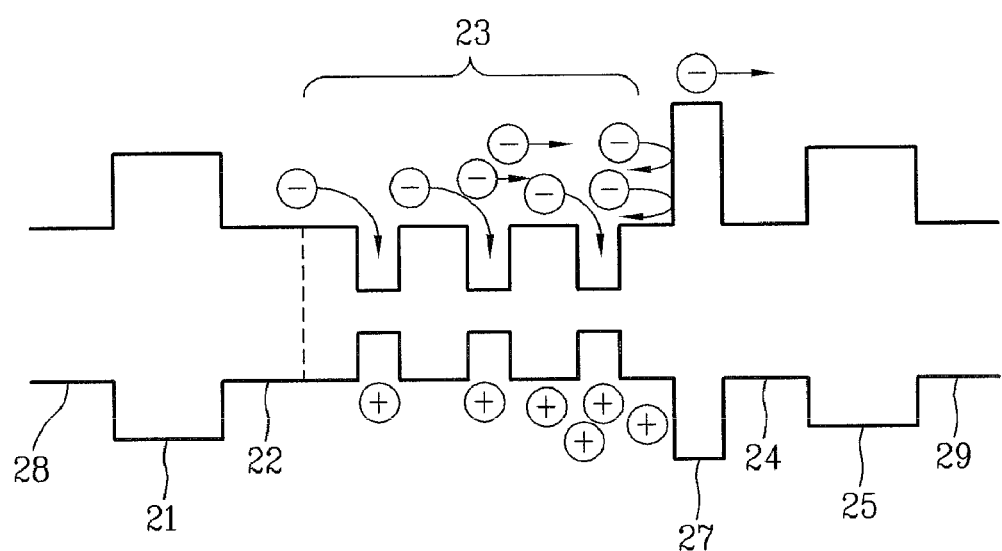
FIG. 2 is a band diagram of the semiconductor laser diode shown in FIG. 1.

An energy band gap related to the above-described diode structure is illustrated by a band diagram of FIG. 2.

When electric power is applied in the diode structure, electrons move from the n-type clad layer 21 toward the p-type clad layer 25 whereas holes move in the opposite direction. Therefore, the holes may be recombined with the electrons by being restricted in the active layer 23, thereby achieving light emission.

Here, when relatively lighter electrons are passing through the active layer 23, the EBL 27 obstructs passage of the electrons which did not perform the recombination, accordingly improving the efficiency of the diode.

However, when such an EBL structure is dedicatedly provided, the whole thin film structure is complicated and this may hinder growth of the thin film. Furthermore, since the EBL is in the vicinity of the active layer, Mg, which is a p-type dopant, and Al, which is one of components of the EBL, may be diffused toward the active layer in case of a longtime or high-temperature operation of the diode. As a result, reliability of the diode would be deteriorated.

In addition, considering properties of an optical mode, an optical confinement factor may be deteriorated by an AlGaN EBL having a low refraction index, or an ideal Gaussian distribution of the optical mode may be distorted.

Second Embodiment

Figure 3:
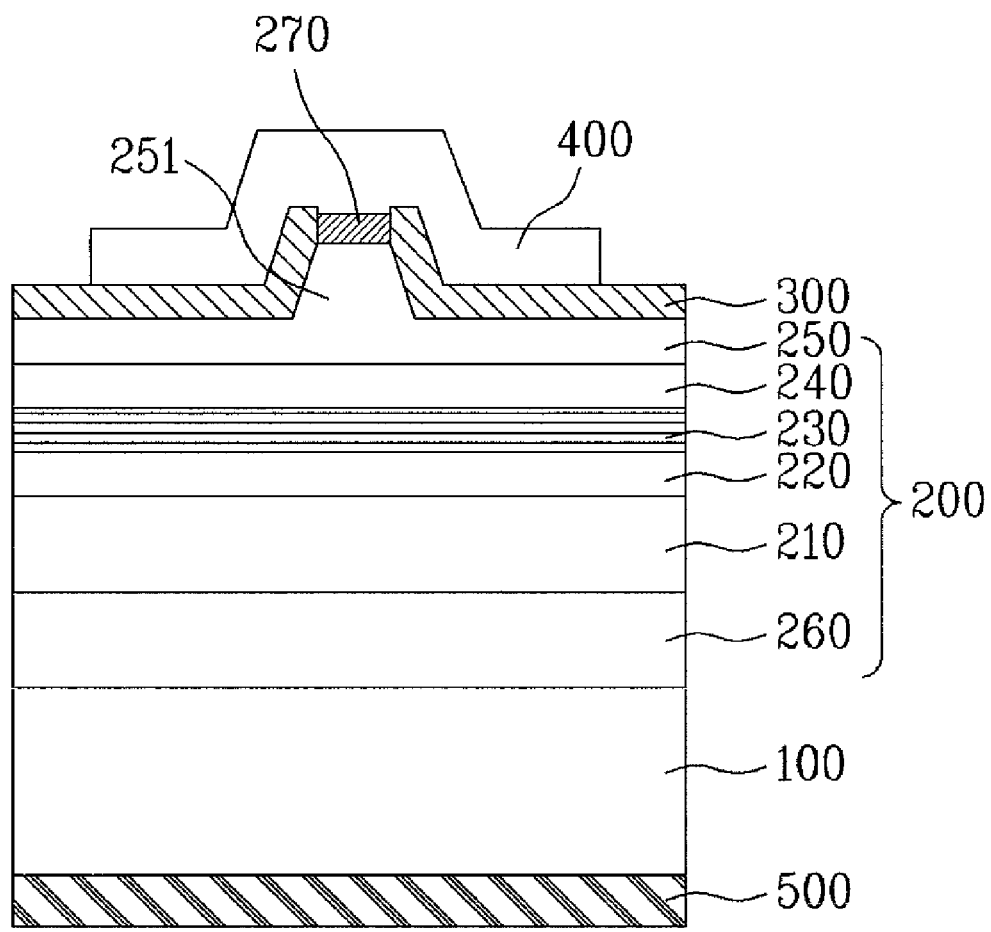
FIG. 3 is a sectional view of a semiconductor laser diode according to a second embodiment of the present invention.

FIG. 3 shows another embodiment of the semiconductor laser diode. As shown in the drawing, the semiconductor laser diode comprises a conductive substrate 100 and a semiconductor thin film structure 200 disposed on the substrate 100.

The semiconductor thin film structure 200 may comprise a GaN-based semiconductor layer.

The semiconductor thin film structure 200 comprises an n-type clad layer 210, an n-type optical guide layer 220, an active layer 230, a p-type optical guide layer 240, and a p-type clad layer 250 which are sequentially disposed on the conductive substrate 100.

An upper side of the p-type clad layer 250 includes a ridge structure 251, and a dielectric layer 300 having an opening corresponding to the upper part of the ridge structure 251 is disposed on the upper side of the p-type clad layer 250.

On an upper side of the dielectric layer 300, a p-type electrode 400 is formed in contact with the p-type clad layer 250 through the opening of the dielectric layer 300. In addition, an n-type electrode 500 is disposed on a lower side of the conductive substrate 100.

An n-type electrode layer 260 may be formed between the conductive substrate 100 and the n-type clad layer 210. Also, a p-type electrode layer 270 may be further formed between the upper part of the ridge structure 251 of the p-type clad layer 250 and the p-type electrode 400.

Figure 4:
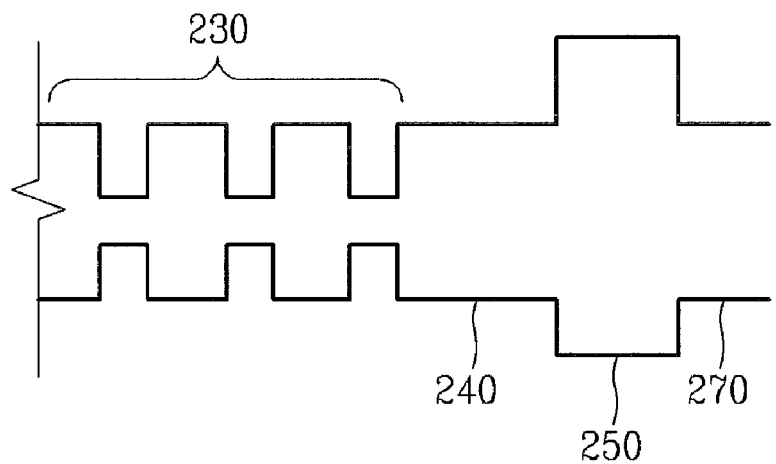
FIG. 4 is an example of a band diagram of the semiconductor laser semiconductor laser diode according to the present invention.

An energy band gap regarding the above-described diode structure is illustrated by a band diagram of FIG. 4.

According to the embodiment shown in FIG. 3 and FIG. 4, the p-type optical guide layer 240 is disposed on the active layer 230, and the p-type clad layer 250 that functions as the electron barrier is disposed on the p-type optical guide layer 240.

Figure 5:
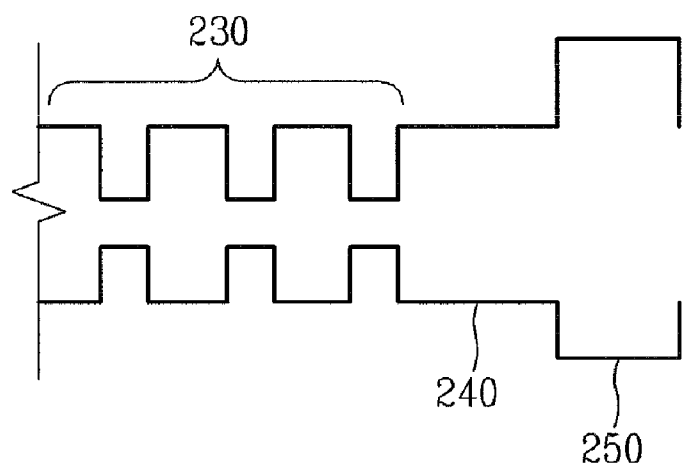
FIG. 5 is another example of a band diagram of the semiconductor laser diode according to the present invention.

In this case, that is, when the p-type clad layer 250 also functioning as the electron barrier is on the p-type optical guide layer 240, an EBL such as layer 27 in FIG. 1 can be omitted. This case is illustrated by a band diagram of FIG. 5.

Figure 6:
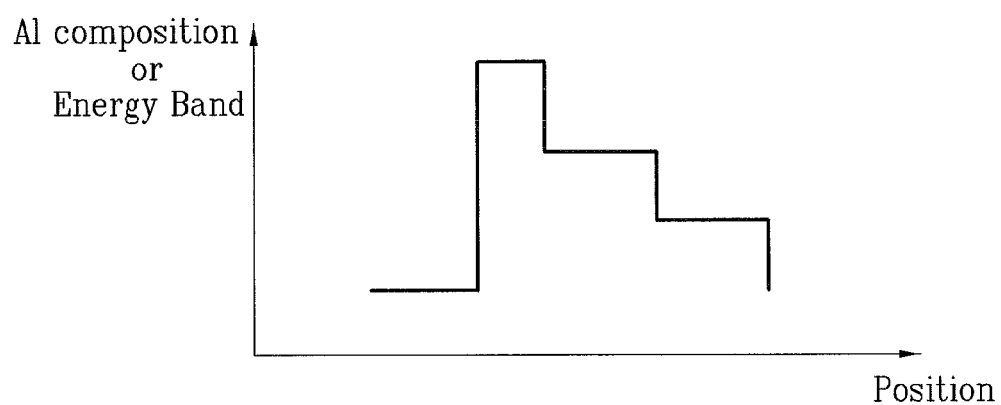
FIG. 6 is a first example of a band diagram of a p-type clad layer according to the present invention.
Figure 7:
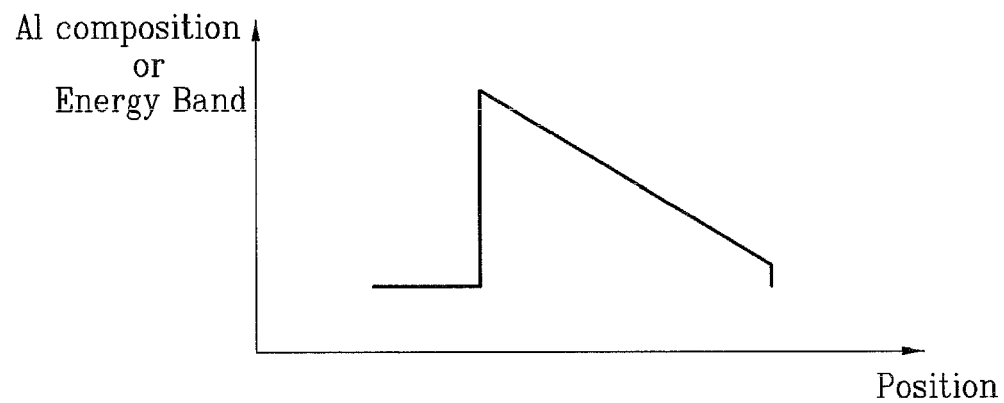
FIG. 7 is a second example of a band diagram of the p-type clad layer according to the present invention.

The p-type clad layer 250 has a greater energy band gap than the p-type optical guide layer 240. As shown in FIG. 6 and FIG. 7, the p-type clad layer 250 may be structured so that the energy band gap decreases as being farther from the p-type optical guide layer 240. Here, the band gap of the p-type clad layer 250 can be decreased up to the band gap of the p-type optical guide layer 240.

FIG. 6 and FIG. 7 are band diagrams of the p-type clad layer 250. Referring to FIG. 6, the band gap is relatively great near the p-type optical guide layer 240 and decreases as being farther from the p-type optical guide layer 240 in a stepwise manner.

Also, as shown in FIG. 7, the band gap of the p-type clad layer 250 may decrease as being farther from the p-type optical guide layer 240 in a gradual manner.

The semiconductor layer may comprise a nitride semiconductor ($Al_xIn_yGa_{1-x-y}N$, $0 \leq x$, $y \leq 1$). In this case, the p-type clad layer 250 may also be implemented by a nitride semiconductor.

Thus, the p-type clad layer 250 may contain Al. Here, the Al exists most at a contacting surface with the p-type optical guide layer 240 and gradually decreases as being farther from the p-type optical guide layer 240.

Although the band gap is increased according to increase of the Al existing at the contacting surface between the p-type clad layer 250 and the p-type optical guide layer 240, it is preferred that the Al occupies about 10~30% of the total components of the nitride semiconductor in consideration of a lattice constant difference and lattice coupling.

Figure 8:
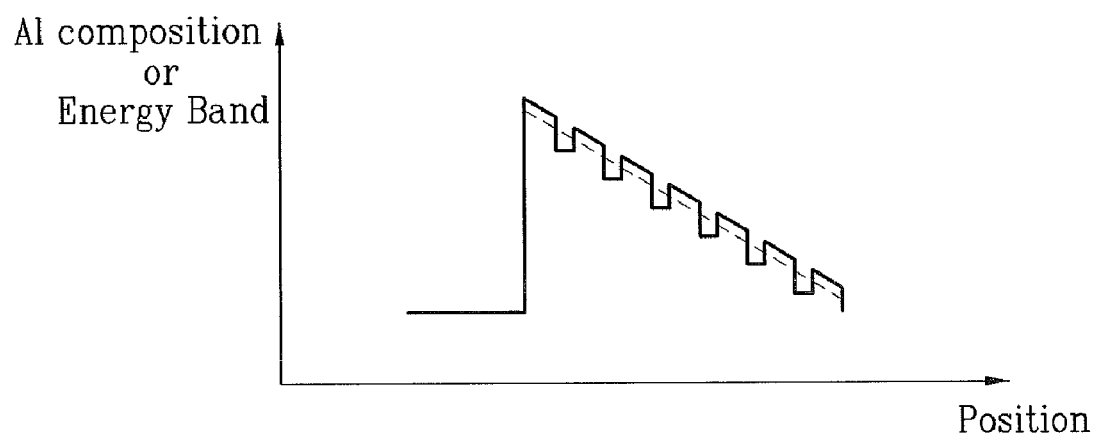
FIG. 8 is a third example of a band diagram of the p-type clad layer according to the present invention.

Also, the p-type clad layer 250 may comprise a superlattice layer as shown in FIG. 8. In this case, the whole band gap may be determined by an average band gap of the superlattice layer.

As described above, the band structure of the p-type clad layer 250 is capable of effectively restricting the passage of electrons to the active layer 230 without requiring a dedicated EBL. Accordingly, the efficiency of recombination between the electrons and the holes is improved, thereby enhancing a light emitting efficiency.

Since the laser structure can be simplified by omitting the EBL, growth of the semiconductor thin film can be performed more efficiently. Also, the dopants such as Mg and Al can be prevented from diffusing, thereby improving reliability of the product.

Furthermore, when the above structure is applied, the thin film structure of the laser diode can be simplified. Therefore, growth of the thin film is facilitated while improving the mass-productivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor laser diode comprising:
   a first clad layer;
   a first optical guide layer over the first clad layer;
   an active layer over the first optical guide layer;
   a second optical guide layer over the active layer; and
   a second clad layer including aluminum over the second optical guide layer,
   wherein the second clad layer comprises a super-lattice layer that includes a first lattice layer and a second lattice layer,
   wherein band gap energy X values of the second lattice layer lie within a range of band gap energy X values of the first lattice layer,
   wherein the band gap energy X values of the first lattice layer decrease in a stepwise manner and the band gap energy X values of the second lattice layer decrease with a substantially continuous slope in a thickness direction based on a composition ratio of the aluminum, and
   wherein a first band gap energy X first lattice layer is greater than a second band gap energy X value of the first lattice layer, the first band gap energy X value of the first lattice layer corresponding to a position closer to the second optical guide layer than a position that corresponds to the second band gap energy X value of the first lattice layer, and
   wherein a first band gap energy X value of the second lattice layer is greater than a second band gap energy X value of the second lattice layer, wherein the first band gap energy X value of the second lattice layer corresponds to a position closer to the second optical guide layer than a position that corresponds to the second band gap energy X value of the second lattice layer.

2. The semiconductor laser diode according to claim 1, wherein the second clad layer is made from a material which includes a p-type semiconductor.

3. The semiconductor laser diode according to claim 1, wherein the second clad layer is made from a nitride semiconductor material.

4. The semiconductor laser diode according to claim 1, wherein a first electrode is formed on the first clad layer and a second electrode is formed on the second clad layer.

5. The semiconductor laser diode according to claim 4, wherein a conductive substrate is located between the first clad layer and the first electrode.

6. The semiconductor laser diode according to claim 4, wherein the second electrode and the second clad layer are in direct contact with each other.

7. A semiconductor laser diode comprising:
   a first electrode;
   a conductive substrate over the first electrode;
   a semiconductor layer having a multi-layer structure, being disposed over the conductive substrate;
   a clad layer including aluminum over the semiconductor layer; and
   a second electrode over the clad layer, wherein:
   the clad layer comprises a super-lattice layer that includes a first lattice layer and a second lattice layer,
   wherein band gap energy X values of the second lattice layer lie within a range of band gap energy X values of the first lattice layer,
   wherein the band gap energy X values of the first lattice layer decrease in a stepwise manner and the band gap energy X values of the second lattice layer decrease with a substantially continuous slope in a thickness direction based on a composition ratio of the aluminum, and
   wherein a first band gap energy X value of the first lattice layer is greater than a second band gap energy X value of the first lattice layer, the first band gap energy X value of the first lattice layer corresponding to a position closer to the second optical guide layer than a position that corresponds to the second band gap energy X value of the first lattice layer, and
   wherein a first band gap energy X value of the second lattice layer is greater than a second band gap energy X value of the second lattice layer, wherein the first band gap energy value of the second lattice layer corresponds to a position closer to the second optical guide layer than a position that corresponds to the second band gap energy X value of the second lattice layer.

8. The semiconductor laser diode according to claim 7, wherein the laminated semiconductor layer comprises:
   a first conductive semiconductor layer;
   an active layer over the first conductive semiconductor layer; and
   an optical guide layer over the active layer.

9. The semiconductor laser diode according to claim 1, wherein the band gap energy X values of at least one of the first lattice layer or the second lattice layer of the second clad layer cause the second clad layer to block electron migration, thereby serving as an electronic barrier layer.

10. The semiconductor laser diode according to claim 1, wherein:
    the second clad layer serves as an electron barrier layer to block migration of electrodes passing through the active layer, and
    the second clad layer is formed over the second optical guide layer, and the second optical guide layer is formed over the active layer, without an intervening electron barrier layer formed between the active layer and second optical guide layer or between the second optical guide layer and the second clad layer.

11. The semiconductor laser diode according to claim 1, wherein:
    a concentration of the aluminum at the positions which correspond to the first band gap energy X values of the first lattice and the second lattice is greater than a concentration of the aluminum at positions which correspond to the second band gap energy X values of the first and second lattice.

12. The semiconductor laser diode according to claim 11, wherein:
    the position which corresponds to the first band gap energy X value of the first lattice is substantially coincident with the position which corresponds to the position of the first band gap energy X value of the second lattice.

13. The semiconductor laser diode according to claim 12, wherein:
    the position which corresponds to the second band gap energy X value of the first lattice is substantially coincident with the position which corresponds to the position of the second band gap energy X value of the second lattice.

* * * * *